(12) United States Patent
De Paiva Martins et al.

(10) Patent No.: US 8,503,059 B2
(45) Date of Patent: Aug. 6, 2013

(54) ELECTROCHROMIC THIN FILM TRANSISTORS WITH LATERAL OR VERTICAL STRUCTURE USING FUNCTIONALIZED OR NON-FUNCTIONALIZED SUBSTRATES AND METHOD OF MANUFACTURING SAME

(75) Inventors: Rodrigo Ferrão De Paiva Martins, Charneca da Caparica (PT); Elvira Maria Correia Fortunato, Charneca da Caparica (PT)

(73) Assignee: Faculdade de Ciências e Tecnologia/Universidade Nova de Lisboa, Caparica (PT)

( * ) Notice: Subject to any disclaimer, the term of this patent is extended or adjusted under 35 U.S.C. 154(b) by 30 days.

(21) Appl. No.: 13/262,834
(22) PCT Filed: Oct. 8, 2009
(86) PCT No.: PCT/IB2009/054425
§ 371 (c)(1), (2), (4) Date: Dec. 20, 2011
(87) PCT Pub. No.: WO2010/112985
PCT Pub. Date: Oct. 7, 2010

(65) Prior Publication Data
US 2012/0081774 A1 Apr. 5, 2012

(30) Foreign Application Priority Data
Apr. 1, 2009 (PT) .......................................... 104482

(51) Int. Cl.
G02F 1/15 (2006.01)
H01L 29/76 (2006.01)
(52) U.S. Cl.
USPC .................... 359/265; 257/213; 257/E51.005
(58) Field of Classification Search
USPC ................. 359/265–275; 257/27, 40, 59, 66, 257/69, 192, 213, E51.001–E51.005, E25.01, 257/E25.001; 438/99; 977/834, 932
See application file for complete search history.

(56) References Cited

U.S. PATENT DOCUMENTS

| 4,163,982 A | 8/1979 | Di Domenico, Jr. et al. |
| 8,379,290 B2 * | 2/2013 | Chun et al. ..................... 359/269 |

(Continued)

FOREIGN PATENT DOCUMENTS

| PT | 103671 A | 9/2008 |
| PT | 103951 A | 7/2009 |

(Continued)

OTHER PUBLICATIONS

Yu-Ju Lin et al.; "Improvement of transparent organic thin film transistor performance by inserting a lithium fluoride buffer layer"; Applied Physics Letters American Institute of Physics USA; vol. 93, No. 4; Jul. 28, 2008; pp. 043305-1; XP002573609.

(Continued)

*Primary Examiner* — Tuyen Tra
(74) *Attorney, Agent, or Firm* — Kenealy Vaidya LLP

(57) ABSTRACT

The presently disclosed subject matter can include or consist of the creation and manufacture of electrochromic thin film transistors, either self-sustaining or not, with lateral or vertical structure, deposited on any kind of functionalized substrate, referred to as electrochromic substrate, or non-functionalized substrate. The electrolyte material and the presence or not of an ultra-thin membrane can act as dielectric element. The electrochromic material can act as active semiconductor of the channel region. The gate, source and drain electrodes can be based on metal materials, such as Titanium, Gold, Aluminum, or degenerate semiconductive oxides, like Indium and Zinc oxide, Gallium-doped Zinc oxide. The device operation control process can be made by means of electronic and ionic current, and the off-state to on-state switch, or vice-versa, can be followed by a change of color of the device.

26 Claims, 3 Drawing Sheets

U.S. PATENT DOCUMENTS

| | | |
|---|---|---|
| 2008/0128687 A1 | 6/2008 | Armgarth et al. |
| 2008/0297878 A1 | 12/2008 | Brown et al. |
| 2009/0026443 A1 | 1/2009 | Ohta |
| 2009/0039343 A1* | 2/2009 | Kugler .......................... 257/40 |
| 2011/0149529 A1 | 6/2011 | Fortunato et al. |

FOREIGN PATENT DOCUMENTS

| | | |
|---|---|---|
| PT | 103998 A | 9/2009 |
| PT | 103999 A | 9/2009 |
| WO | 02/071140 A1 | 9/2002 |
| WO | 2008/090257 A1 | 7/2008 |
| WO | 2009/096802 A1 | 8/2009 |

OTHER PUBLICATIONS

David Nilsson et al.; "The Electrochemical Transistor and Circuit Design Considerations"; Proceedings of the 2005 European Conference on Circuit Theory and Design, Ireland Aug. 29-Sep. 1, 2005, Piscataway, NJ, USA; vol. 3; Aug. 29, 2005; pp. 349-352; XP010845333.

International Search Report for PCT/IB2009/054425 dated Apr. 7, 2010.

* cited by examiner

ELECTROCHROMIC THIN FILM TRANSISTORS WITH LATERAL OR VERTICAL STRUCTURE USING FUNCTIONALIZED OR NON-FUNCTIONALIZED SUBSTRATES AND METHOD OF MANUFACTURING SAME

This application is a U.S. national phase filing under 35 U.S.C. §371 of PCT Application No. PCT/IB2009/054425, filed Oct. 8, 2009, and claims priority under 35 U.S.C. §119 to Portuguese patent application no. 104482, filed Apr. 1, 2009, the entireties of both of which are incorporated by reference herein.

FIELD

The presently disclosed subject matter is based on the creation and manufacture of an electrochromic thin film transistor, either self-sustaining or not, produced in vitroceramic, polymeric, metallic, or natural, synthetic or mixed paper substrates, either functionalized, i.e. the bulk thereof contains the electrolyte material on the gate side and the electrochromic material on the substrate side where the drain and source electrodes are positioned, from now on referred to as electrochromic substrates, or non-functionalized and referred to merely as substrates, that is current-controlled and wherein the change of state is followed by a change of colour that is reversible.

The functionalization of the electrochromic substrate can consist of or include integrating the electrolyte and electrochromic materials into the bulk of the substrate, while in normal substrates the deposition is carried out onto the surface of the gate electrode and counter-electrode (4); the deposition or not of an ultra-thin membrane (7); the electrolyte material (3); the electrochromic material (2); and the drain and source electrodes (5), in the form of a lateral or vertical structure, including insulation or encapsulation islands (6).

In case the substrate is functionalized with the electrolyte and electrochromic material, from now on simply referred to as electrochromic substrate, the two side-faces of the substrate are used, one for depositing the gate electrode and the other for depositing onto the channel region the source and drain electrodes, as shown in FIG. 2. In this case, the surface of the functionalized substrate may be passivated or encapsulated.

The operating principle of the invention is based upon the change of the oxidation state of an oxide, such as, for example, the stoichiometric or non-stoichiometric tungsten oxide ($WO_3$), through the action of the induced ionic charges from the electrolyte, via the presence or not of a membrane (7), to the electrochromic material by means of the gate electrode-applied voltage that can be modulated and whose redox reaction is laterally or vertically activated by the electronic current established between the drain (5) and the source (5), leading to a variation of the electronic conductivity of the electrochromic material (2) of several orders of magnitude, that is, from a state where no current flows between the drain and the source to a state where there is a flow of current also associated with a sudden change of colour, which is maintained without applying the electric field and induced current that created it, or returns to the original state by reversing the direction of the current or the voltage applied to the gate electrode. That is to say, in the presently disclosed subject matter the channel region of the transistor (2) and the gate electrode (4) are ionically connected by means of the electrolyte (3), with or without the presence of an ultra-thin membrane (7), but they are not electronically connected.

In the presently disclosed subject matter, when the substrate is a flexible one, of polymeric nature or made of paper (1), the functionalization thereof is made by dipping the same in a solution of nanoparticles of an electrochromic oxide and a salt (see FIG. 2). Unlike the known electrochromic devices, wherein besides the electrochromic material, an electrolyte and a counter-electrode are required, that is not necessary in this invention. In this same functionalized face the drain and source regions (5), constituted by a metal or degenerate semiconductive oxide, either inorganic or organic, are positioned according to a certain pattern by means of a physical, chemical, chemical-physical deposition technique. On the other face of the substrate the gate electrode (4), of an organic or inorganic nature but highly conductive, is deposited by one of the techniques mentioned above. In these conditions, the substrate integrates the device itself, which is self-sustaining.

In case the substrate is a non-functionalized one, the electrochromic transistor is manufactured by depositing onto the substrate the set of layers that constitutes it according to what is shown in FIG. 1, wherein insulation islands (6) are used that are made of electrically insulating and non-electrochromic materials and also serve the function of encapsulating the final device, with the possibility of including an ultra-thin membrane (7) between the gate electrode (4) and the electrolyte (3). In the presently disclosed subject matter, the structure of the thin film transistor may be lateral or vertical, according to what is shown in FIG. 3.

In the presently disclosed subject matter, the electrochromic materials, the electrolyte materials, and the electrode materials that constitute the device can be of an organic or inorganic nature, and are processed by physical, chemical and physical-chemical deposition technologies for reactive and non-reactive thin or thick films, which are conducted at temperatures from near the room temperature up to temperatures of 450° C., namely:

- direct current or radiofrequency sputtering;
- resistive or vacuum electron-gun thermal deposition;
- chemical vapour decomposition assisted or not by radiofrequency or UHF plasma;
- vacuum heating;
- epitaxial atomic growth;
- ink-jet deposition;
- sol-gel
- pyrolysis
- chemical emulsion.

These techniques allow the controlled growth of films of organic and inorganic materials with thicknesses ranging between 1 nm and 50 µm.

SUMMARY

The presently disclosed subject matter describes a process for the manufacture and creation of an electrochromic thin film transistor that incorporates a thin or thick film of an organic, inorganic, or mixed nature as substrate (1), which is either functionalized or non-functionalized with an electrolyte material (3) upon which it is either deposited or not an ultra-thin membrane (7) that separates it from the gate electrode (4), both acting as dielectric element, wherein the electrochromic material (2) acts as active semiconductor of the channel region, and the gate (4), source (5) and drain (5) electrodes are based on metal materials, such as Titanium, Gold, Aluminium, or degenerate semiconductive oxides, like Indium and Zinc oxide, Gallium-doped Zinc oxide, characterized in that the device operation control process is made by means of electronic and ionic current, and the off-state to on-state switch, or vice-versa, is followed by a change of colour associated with the electrochromic material.

One exemplary embodiment of the presently disclosed subject matter bears the characteristic of the thin film acting as substrate (1) being possibly functionalized with solutions containing the electrochromic material and the electrolyte material, thereby operating as an active component of the transistor which is referred to as electrochromic component.

Another exemplary embodiment of the presently disclosed subject matter can consist of or include the functionalized material acting as substrate (1) being possibly a vitroceramic material, a polymer, metal foil, or paper, referred to as electrochromic substrate, with thicknesses ranging between 5 and 500 micrometers.

A further exemplary embodiment of the presently disclosed subject matter bears the characteristic of incorporating one or more additional organic or inorganic components, with the electric characteristics of a metal or degenerate semiconductor (4, 5), electrochromic material (2), electrolyte (3) or adaptation material, built into single, composite, or multi-layered structures in order to provide active devices with two, three, or four hybrid terminals, discrete or integrated, that act simultaneously as switching key and electrochromic device with associated change of colour.

A still further exemplary embodiment of the presently disclosed subject matter bears the characteristic of applying onto the substrate (1) a passivation or adaptation thin layer (6) before any other component element of the final device is deposited.

A still further exemplary embodiment of the presently disclosed subject matter bears the characteristic of said passivation or adaptation layer to be applied being comprised by a dielectric material of high electrical resistivity, particularly with thicknesses up to 2000 micrometers, which includes amorphous multicomponent oxides of tantalum and silicon, or tantalum and aluminium, or tantalum and hafnium, or magnesium fluoride, or zinc oxide, or polyvinyl or a resin such as polymethyl methacrylate.

Another exemplary embodiment of the presently disclosed subject matter bears the characteristic of comprising the deposition of components by means of one or more of the following methods: by resistive or vacuum electron-gun thermal evaporation, direct current or radiofrequency or ultra-high frequency sputtering assisted or not by magnetron, by chemical vapour deposition assisted or not by radiofrequency or ultra-high frequency, by ink-jet printing, by chemical emulsion, by sol-gel, by pyrolysis, by deep coating.

Another exemplary embodiment of the presently disclosed subject matter bears the characteristic of depositing thin films according to specific drawings that are directly printed by means of a protective resin before or after the production process, using masks, or mechanical mask, or direct writing onto the materials deposited on the paper.

Another exemplary embodiment of the presently disclosed subject matter bears the characteristic of depositing a conductive component or components (4, 5) that comprise an organic or inorganic metal material or semiconductive oxide of high conductivity.

Another exemplary embodiment of the presently disclosed subject matter bears the characteristic of depositing an electrochromic component or components (2) that comprise a single or composite ionic inorganic or organic material.

Another exemplary embodiment of the presently disclosed subject matter bears the characteristic of depositing an electrolyte component or components (3) that comprise an organic, or single or composite ionic inorganic material, or an ultra-thin membrane (7) of an inorganic nature, such as zinc oxide, or the oxides of tantalum and silicon, or tantalum and aluminium, or tantalum and hafnium, or of an organic nature, such as polyvinyl or polymethyl methacrylate.

Another exemplary embodiment of the presently disclosed subject matter bears the characteristic of encapsulating the final device by means of an inorganic or organic dielectric element or by means of lamination.

The presently disclosed subject matter still describes an electrochromic active thin film transistor comprising a support, which can be made of a thin or thick film (1), that acts either as a support or as a bulk functionalized support (1,2,3) for said device, referred to as electrochromic substrate, thereby making it self-sustainable.

A still further exemplary embodiment of the presently disclosed subject matter bears the characteristic of the substrate (1) being able to comprise natural, synthetic, or mixed cellulosic material.

Another exemplary embodiment of the presently disclosed subject matter bears the characteristic of additionally comprising one or more organic or inorganic components, with the electric characteristics of a metal (4,5), electrochromic material (2), electrolyte material (6), built into single, composite, or multi-layered structures, in order to provide active electrochromic devices, in particular electrochromic thin film transistors or electrochromic active matrices.

Another exemplary embodiment of the presently disclosed subject matter bears the characteristic of the conductive component or components (4,5) being comprised by an organic or inorganic, metal material or semiconductive oxide of high conductivity.

Another exemplary embodiment of the presently disclosed subject matter bears the characteristic of the device being shaped as an electrochromic thin film transistor that is able to switch from the on-state to the off-state with associated change of colour.

A still further exemplary embodiment of the presently disclosed subject matter bears the characteristic of comprising two materials of high conductivity with exactly equal conductivities and spaced apart by distances that range from 1 nm to 1000 μm, referred to as drain region and source region (5), respectively, deposited onto the electrochromic material that constitutes the channel region of the device.

Another exemplary embodiment of the presently disclosed subject matter bears the characteristic of the drain and source regions (5) being comprised by an organic or inorganic material with conductivities of at least three orders of magnitude larger than the electrochromic material of the channel region (2), being used as drain and source regions (5) of the electrochromic thin film transistor.

Another exemplary embodiment of the presently disclosed subject matter bears the characteristic of the region below or above the channel region being comprised by an organic or inorganic electrolyte material (3) with conductivities of at least two orders of magnitude larger than the electrochromic material in the oxidised state (2).

Another exemplary embodiment of the presently disclosed subject matter bears the characteristic of the gate electrode (4) being contiguous to the electrolyte, or being deposited onto one of the side-faces of the substrate when the latter is functionalized.

BACKGROUND

An electrochromic device is conventionally understood as being a system that includes a material whose optical characteristics (e.g. the colour) vary when subjected to a potential difference. Throughout the electrochemical process (electrochromic activation by means of the potential difference, wherein the material suffers an oxidation or reduction process—electron loss or gain, respectively) there is a charge flow which is necessary to balance by means of an electrolyte—a mixture of chemical substances (ions—negatively and positively charged particles) that have the ability to "move" between the electrodes. Finally, and in order to complete the circuit, an electric charge balance substance is required. The function of this latter element is to follow the electrochemical process of the electrochromic component as far as electrons are concerned. [1-4]

Electrochromic devices are usually used in glass or plastic substrates that are applied to windows, namely in the building and automotive industries, but the substrate functionalization and the integration thereof in active devices constitute an innovation.

Beyond that, we are unaware of the existence of any electrochromic transistor devices like the ones proposed herein.

In the following we will describe the state of the art and patents preceding this invention, with which it might be related.

Concerning the research and development or application fields, we are unaware of any activity in close proximity or corresponding to an aspect of the presently disclosed subject matter, as far as the integrated process and product features and resulting uses are concerned.

By searching the literature we found the following patents related to classic electrochromic devices, of which we present some examples:

US 2008/0297878 A1 refers to an electrochromic device including a fibrous organic substrate that bears nothing in common with the now proposed electrochromic transistor device.

PCT/PT2009/000008 refers to the processing of electric and or electronic and or electrochromic elements in cellulosic material substrates, distinct from aspects of the different invention.

The Portuguese patent application n° 103951 of 2008 refers to the use of cellulosic or bioorganic-based paper as physical support for the processing of electronic devices and systems, and not to the integration thereof in the manufacture process and maintenance of the electronic devices and systems. It bears nothing in common with the presently disclosed subject matter.

The Portuguese patent application 103671 refers to the use of electrochromic device structures as solid state timers, bearing nothing in common with the presently disclosed subject matter.

The Portuguese patent applications 103998 and 103999 refer to transistors wherein the paper is an active part of the devices. In this case, however, neither the paper is functionalized nor the devices change their colour or are controlled by the ionic and electronic currents. That is to say, an aspect of the invention is distinct from the presently disclosed subject matter.

From what was just presented one can conclude that, to our knowledge, there is no patent application or published result concerning the creation of product and processes mentioned in the presently disclosed subject matter.

The cited patents and references correspond to the state of the art to which the presently disclosed subject matter pertains and with which it has some overlapping borderline features, related to the used processes and materials and the fact that the manufacture processes and techniques are similar in some cases. We are, however, unaware of the existence of any works and patents or technical patent applications that focus on aspects of the presently disclosed subject matter: electrochromic transistor using functionalized or non-functionalized substrates.

The presently disclosed subject matter can consist of or include creating a new active device that acts simultaneously as switching key and electrochromic device, using non-functionalized or functionalized substrates, that is to say, wherein the substrate itself contains in its bulk the electrolyte and the electrochromic materials, such as, for example, polymer or natural, synthetic, or mixed cellulosic paper. We are unaware of the implementation of this kind of devices, whether in an attempted or fully accomplished laboratory form. These are aspects of the presently disclosed subject matter that results in a hybrid, and yet monolithic quality—concerning the integration of electronic components that produce new effects and add a new value when applying the invention—that is not present in the systems belonging to the state of the art.

1—Organic or inorganic substrate of high electrical resistivity, or coated or passivated with a dielectric film of high electrical resistivity;

2—Electrochromical material of an organic or inorganic nature;

3—Electrolyte of an organic or inorganic nature;

4—Gate electrode made of an organic or inorganic material of high electrical conductivity;

5—Material of high electrical conductivity, of an organic or inorganic nature, constituting the so-called drain and source regions;

6—Electrical insulation islands made of a material with very high electrical resistance that is also used to encapsulate the entire device;

7—Ultra-thin membrane made of an inorganic or organic material through which the ionic exchanges leading to ion migration from the electrolyte material into the electrochromic material occur, resulting in the reversible redox reaction.

Figure 2:
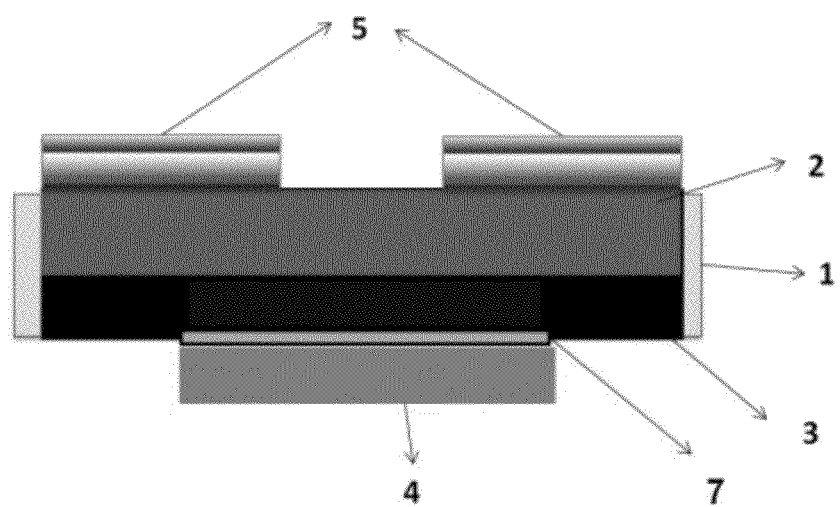

FIG. 2. Schematic view of the basic structure of an electrochromic film transistor with a functionalized substrate, referred to as electrochromic substrate.

Figure 3:
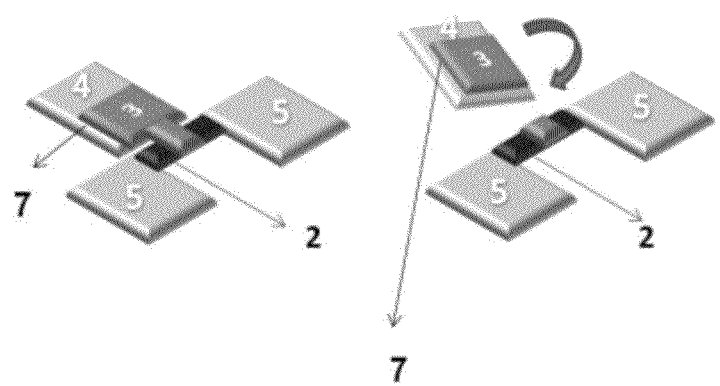

FIG. 3. Schematic view of electrochromic thin film transistors deposited onto non-functionalized substrates with lateral or vertical structure, as shown in the figure. The arrow indicates the rotational direction of the set comprised by the electrolyte and gate electrode to afford a device with a vertical structure.

DETAILED DESCRIPTION EXEMPLARY EMBODIMENTS OF THE PRESENTLY DISCLOSED SUBJECT MATTER

The presently disclosed subject matter makes use of a set of chemical, chemical-physical, or physical technologies for manufacturing and depositing solutions containing nanoparticles of an electrochromic oxide (2), with particle sizes up to 200 nm, to which a salt (electrolyte (3)) can be added in order to functionalize them, and also for manufacturing and depositing the materials that constitute the gate (4) and drain and source (5) electrodes, besides the insulation islands (6). In addition, it also makes use of processes for depositing transparent electrodes, of an organic or inorganic nature, conducted at temperatures close to room temperature or around 450° C., by means of a known technique, possibly of the ink-jet printing type, or spin coating, or sol-gel, or atomization, or pyrolysis, or direct current or radiofrequency sputtering, or resistive thermal deposition, or epitaxial atomic growth.

The presently disclosed subject matter can consist of or include using substrates of different origins and compositions, or functionalized substrates acting simultaneously as physical support and electrochromic material, referred to as electrochromic substrates, that lead to the creation of electrochromic thin film transistors, wherein the temperature of the deposition process is compatible with the type of selected substrate.

The presently disclosed subject matter is amenable to distinct configurations depending on the specific application that is intended. That is to say, the presently disclosed subject matter corresponds to creating a new device that exhibits a set of innovative functions of new active electrochromic devices which, by means of using new and innovative processes, afford new products and systems involving materials like thin polymers, such as mylar or paper, serving the double function of physical support and component of active devices.

Fundamentals

The presently disclosed subject matter concerns the creation and manufacture of a new electrochromic thin film transistor using functionalized substrates, referred to as electrochromic substrates, or non-functionalized substrates, generally referred to as substrates, of different origins and compositions, either stiff or flexible, such as mylar, paper, vitroceramics and others, a process for simultaneously act as switching keys and allow the fast colour switch when turning from the off-state to the on-state. In this way it will be possible to constitute active electrochromic matrices wherein the pixel and the switching key correspond to the electrochromic thin film transistor. It is thereby possible to produce active matrices with large areas and switching times smaller than seconds, a feature that is not possible to achieve with the known electrochromic devices wherein, for large areas, the colour switching times can go up to several minutes.

With this invention it is possible to manufacture active displays, either dynamic or static (passive), in smart transmittance control surfaces, such as wind-screens and automobile windows or visors, which is not possible to achieve with the present devices that take too long, since the larger the area the larger the resistivity of the associated components, and therefore the larger the switching time for the device to turn from the form that is transparent to the human eye into the translucent form of dark or another colour, this being a function of the type of electrochromic material used and also of the corresponding redox reaction that occurs. In this sense, the presently disclosed subject matter corresponds to a huge qualitative jump relative to the current state of the art.

The device is comprised by a (stiff or flexible) substrate which is either non-functionalized or functionalized.

In case the substrate is non-functionalized, each transistor that belongs to a possible active matrix (see FIG. 1) is manufactured from the deposition of a degenerate semiconductive oxide or metal, either of an organic or inorganic nature (4), followed by the deposition of an organic or inorganic electrolyte material (3), an organic or inorganic electrochromic material (2); the deposition of the insulation islands (6), and the deposition of the drain and source regions (5), making use of a degenerate semiconductor or a metal, either of an organic or inorganic nature, by means of any of the deposition techniques previously mentioned.

On top of the device it is optional to place a material that acts as a protecting agent (6), such as, for example, the lamination or the deposition of a protective layer, such as magnesium fluoride, or amorphous compounds of oxides of tantalum and silicon, or tantalum and aluminium, or tantalum and hafnium.

The presently disclosed subject matter is based on the fact that an electrochromic material suffers a change in its optical properties when subjected to a certain potential difference which is static, dynamic, or instantaneous. The electrochromic materials can be divided in two categories: inorganic oxides and organic materials. Another classification system is based upon the potential at which the colouring process occurs. Thus, the electrochromic oxides (inorganic materials) can adopt a cathodic colouring when the coloured state is induced by negative voltages, this being the case of the oxides of Ti, Nb, Mo, Ta, and W, or anodic colouring when the coloured state is induced by positive voltages, this being the case of the oxides of Cr, Mn, Fe, Co, Ni, Rh, and Ir, all of them being transition metal oxides. The redox reaction for an inorganic electrochromic oxide is given by the following general equations:

Cathodic Colouring:

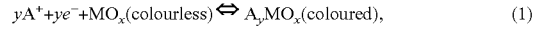

$$yA^+ + ye^- + MO_x(\text{colourless}) \Leftrightarrow A_yMO_x(\text{coloured}), \quad (1)$$

$$A^+ = H^+, Li^+, Na^+, Ag^+, \quad (2)$$

Anodic Colouring:

$$yA^- + yh^+ + MO_x(\text{colourless}) \Leftrightarrow A_yMO_x(\text{coloured}), \quad (3)$$

$$A^- = F^-, CN^-, OH^-; 0 < y < 0.3 \quad (4)$$

wherein the letter M refers to the metal species that is present, O means oxygen and y and x refer to the respective molar percentages that are present in the reaction leading to the change of colour.

In addition to the inorganic materials one must also consider the organic ones, namely the materials that were discovered in the last decade and exhibit exceptional electrochromic properties, such as vialogens, which possess a rather attractive feature that can consist of or include the possibility of adopting different colours according to the introduction of different substituents in the molecules thereof.

The polymeric electrochromic materials, also belonging to this class, have some advantages when compared with other electrochromic materials. The production and development costs for these polymers are generally lower than those for inorganic electrochromic materials, whose layers are usually deposited by means of processes such as electron gun-assisted thermal evaporation, or sputtering assisted or not by magnetron, or epitaxial molecular growth, or radiofrequency plasma-assisted chemical vapour decomposition. The possibility of the same material to exhibit different colours according to the activator or stabilizer elements that are added to the polymer is also a great advantage compared to the other electrochromic materials. One example of this kind of (multicoloured electrochromic) material is polyaniline: with the successive rise of the anodic potential, the transparent layer changes into green, blue, and then purple. The polymeric electrochromic materials, being organic materials, are in their great majority chemically unstable and present a high sensitivity to UV radiation, this being the main reason for the tiny operating life of a device in an external environment (outdoors) application.

The production process of the materials described above is based on chemical, physical, or chemical-physical techniques, such as chemical vapour decomposition (CVD *Chemical Vapour Decomposition*) [6,7]; rf plasma-assisted chemical vapour decomposition (PECVD, see FIG. 4), pulsed laser [8]; sol-gel [9,10]; dipping techniques; atomized pyrolysis [11]; direct current or radiofrequency sputtering [12-14], with or without the presence of a magnetron; heated filament or electron gun thermal evaporation [6]; electrochemical growth [6,15]; ink-jet printing [16], sol-gel; deep coating; pyrolysis, among others.

The electrochromic thin film transistors that are an aspect of the present patent require, in addition to the electrochromic material, the inclusion of a material referred to as marker (electrolyte or ionic conductor). This material, through the movement of the ion species that pass over the electrochromic material, will modify the optical density (colouring) thereof. Thereby we have:

$$yA^+ + ye^- + MO_x(\text{colourless}) \Leftrightarrow A_y MO_x (\text{coloured}) \quad (5)$$

wherein $$A^+ = H^+, Li^+, Na^+. \quad (6)$$

For the function thereof, the electrochromic thin film transistor uses the properties of ionic and electronic current variations that lead to a change of colour when the device is switched from the off-state, wherein the current passing through the electrochromic material is very low, to the on-state, wherein the current rises more than one order of magnitude, thereby resulting in a change of colour of the oxide (redox reaction) according to equation 5, with a corresponding sudden variation of the electronic conductivity of the electrochromic material.

The electrochromic thin film transistor with lateral structure, as shown in FIG. 3, is comprised by a narrow strip of an electrochromic material, either stoichiometric or not, such as tungsten oxide ($WO_x$, with $0.5 < x \leq 3$), that defines the channel region of the transistor. The gate electrode is connected to the channel region through an electrolyte material, either stoichiometric or not, such as lithium perchlorate ($LiClO_y$, with $0.5 < y \leq 4$), ionically but not electronically, that is to say, the application of a gate voltage induces a redox reaction to occur within the electrochromic material, being activated, from the drain region into the source region, by the established electronic current, thereby leading to the change of colour of the entire channel region, referred to as matrix pixel. For the vertical transistor (similarly to what happens to an electrochromic window), the transparent gate electrode is positioned above the electrolyte (see FIG. 3).

In either case, the electric current flow between the source and the drain (5) is modulated by the variation of the resistance of the channel region (electrochromic material) due to the redox reaction that is induced by the potential applied to the gate electrode, thereby establishing an ionic current between the electrolyte and the electrochromic material according to one of the equations 1 to 4. For example, when an inorganic electrochromic material is used, such as, for example, $WO_x$, when the potential applied to the gate electrode is zero, the gate current is also zero and the device is in the so-called off-state. When the potential applied to the gate electrode is different from zero (electrochromic material polarity-dependent), the material becomes conductive and its colour changes. The reverse situation occurs when the electrochromic material is an organic one.

Concerning the operation of the electrochromic thin film transistor, an important parameter is the colouring efficiency (CE), expressed in $cm^2 C^{-1}$, that determines the optical behaviour of the electrochromic materials as a function of the stimulus, in the present case the electric field. For computing this parameter, the total injected/extracted charges by unit area as well as the optical density ($\delta_{OD}$) must be known.

The resulting optical density of the charge flow will be given by:

$$\delta_{OD} = \log(T_0(\lambda)/T_c(\lambda)) \quad (7)$$

wherein $T_0$ represents the initial transmittance and $T_c$ represents the transmittance after colouring has occurred, for a given wavelength $\lambda$.

The colouring efficiency is given by the following equation:

$$CE(\lambda) = \delta OD(\lambda)/Q, \quad (8)$$

wherein Q means the transferred charge.

In addition to the electrochromic material and the marker, an integral part of the electrochromic thin film transistor is an electrolyte material.

When considering the inorganic solid electrolytes, several can be considered, and the most used in and adequate for the presently disclosed subject matter are $Li_3N$, $LiALF_4$, $LiNbO_3$, either in stoichiometric form or not, due to the excellent characteristics of penetration and mobility associated with lithium.

Polymeric electrolytes are characterized by possessing one or more polymers as base or matrix. Among the most used and studied salts of this type of electrolytes one can mention $LiClO_4$, $LiI$, $LiBr$, $LiAsF_6$, and $LiCF_3SO_3$, either in stoichiometric form or not. The major advantage of this type of electrolytes is the possibility of acting also as encapsulating agent.

Concerning the conductivities for the different types of electrolytes previously described, one can expect variations ranging between 0.33 S/cm and $10^{-8}$ S/cm (for inorganic and organic solid electrolytes), a property that will determine the response time and therefore the process of progressive change of colour associated with a given physical, either cross-sectional or lateral, space.

According to what was previously described, the device can be developed in different types of substrates, such as glass, polymer, and paper. The materials used as support or substrate may or may not be transparent, depending on the application of the device.

According to what was previously described, the device will comprise two metal electrodes or electrodes with a metal behaviour that allow applying or inducing the static electric field and charge control, if required made of good conductive metal materials, such as chromium, titanium, silver, aluminium, gold, and other compounds based on the cited elements, as well as transparent conductive oxides with high conductivity, such as, for example, alloys of oxides of indium and zinc; indium and tin; gallium-doped zinc oxide, or multicomponent oxides of zinc, gallium, and indium.

According to what was previously described, the device may or may not be encapsulated, using vitreous or polymeric materials, by means of gluing or lamination, for example. The materials used as support or substrate may or may not be transparent, depending on the application of the device.

According to what was previously described, if the substrate is a functionalized one, referred to as electrochromic substrate, the presently disclosed subject matter creates a method wherein the need to use an electrolyte for charge exchanges with the electrochromic material is avoided, besides the fact that it does not require a counter-electrode and allows the self-sustaining property thereof. That is to say, the presently disclosed subject matter gathers in a single element the five juxtaposed elements required up to the present, these being: the substrate, the electrolyte, the electrochromic material, and the counter-electrode, intended for the structure of electrochromic devices, and a battery, for charge supply and storage. In the presently disclosed subject matter, the creation of the method for functionalizing the paper fibres, or polymeric fibres, or the bulk of a polymeric material, such as mylar, or the bulk of a vitroceramic material of very small thickness (below 1 mm), provides it with the previously mentioned abilities, to which it is merely necessary to add the electrodes, namely the gate electrode on one of the side-faces of the functionalized substrate, and drain and source electrodes on the other side-face of the substrate, respectively.

On the other hand, the development of unconventional processing techniques, like ink-jet printing, opened the possibility of writing on paper based on the use of inks comprised by chemical solutions wherein the precursors and additives thereof possess the desired physical-chemical functionalities.

In this context, the method of substrate functionalization that underlies the presently disclosed subject matter is based on printing inks comprised by chemical solutions that contain nanoparticles of electrochromic oxides and a salt, such as, for example, Lithium, that soak up the fibres of the paper, or polymeric substrate, or vitroceramic substrate of very small thickness, or mylar with hydrophilic properties, and thereby allow a fast and bulk wetting to occur, followed by hydrophobic coatings for protecting the functionalized substrate (6) and allowing the deposition of the connecting electrodes, or other devices that one may wish to add to the system, without damaging the functionalities of the electrochromic system, whose connection can be made by contact window, referred to as via-holes.

This development allows obtaining low cost, disposable, and self-sustaining electronic materials and devices, and opens the possibility of introducing a dynamic component into the functionalized substrate.

DETAILED DESCRIPTION

Figure 1:
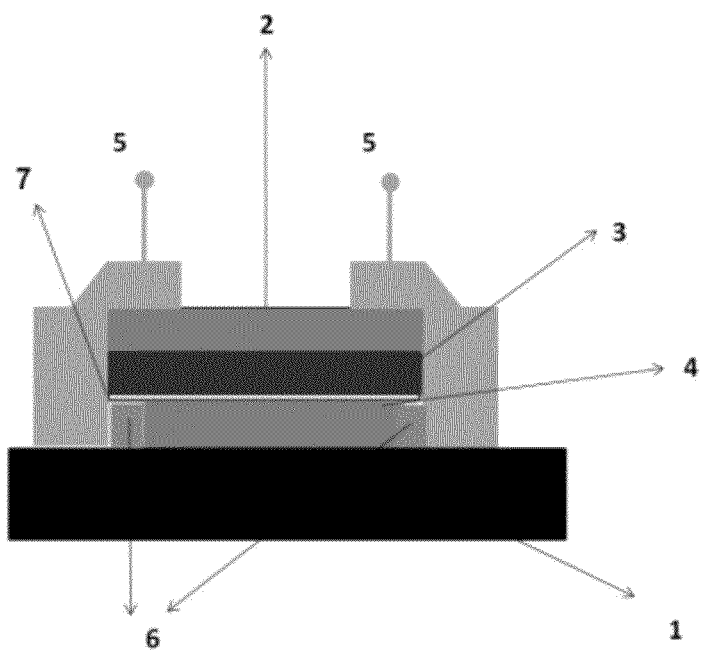
FIG. 1. Schematic view of an electrochromic thin film transistor deposited onto a non-functionalized substrate.

As previously mentioned, the presently disclosed subject matter relates to the creation and manufacture process of thin film transistor-based electrochromic devices wherein the channel region changes its colour when the transistor switches from the off-state to the on-state (see FIGS. 1 to 3). The device is comprised by a substrate (1) which is either non-functionalized (FIG. 1) or functionalized (FIG. 2), with lateral or vertical structure (FIG. 3).

In case the stiff or flexible substrate is a non-functionalized one, onto it a gate electrode (4) is deposited, followed by the deposition of an electrolyte (3) containing the marker element that will react with the electrochromic material (2) that is deposited onto the latter, thereby leading to the observed change of colour, in the juxtaposed or layered form, accelerated by the current that flows between the drain and the source, which is a function of the device operating mode, namely cross-sectional colouring variation or longitudinal colouring variation. In the far ends of the device (see FIG. 3) the drain and source electrodes (5) are positioned; when connected to a battery they allow accelerating, together with the gate control voltage, the diffusion of the $Li^+$ ions from the electrolyte salt into the electrochromic material. The diffusion of the lithium ions depends on the structure, stoichiometry, and morphology of the electrochromic material [5,6,15]. The coloured front is initiated close to the anode (terminal connected to a positive potential), and the higher the applied voltage the faster is the progression thereof. When the stiff or flexible substrate is a functionalized one, the bulk thereof contains electrochromic material on one side and electrolyte material on the other side (see FIG. 2). The functionalization can be made using chemical solutions that contain nanoparticles, which we shall refer to as functionalized electrochromic inks, plus a salt that contains ions, such as Lithium, from which the substrate is provided with characteristics simultaneously of an electrochromic material and an electrolyte by means of a technology such as ink-jet printing, or deep coating, or atomization, or sol-gel, or other, without the need to use a counter-electrode to manufacture electrochromic devices.

As previously mentioned, the presently disclosed subject matter relates to a manufacture method that allows creating within the substrate additive and simultaneous functions of electrochromic material and electrolyte and charge storage device, providing the substrate with functionalities of solid state self-sustaining electrochromic device or system, whose functions were unknown before the presently disclosed subject matter.

According to what was previously mentioned, the functionalization of the substrate with electrochromic material and electrolyte is conducted by dipping it in a chemical solution that contains nanoparticles of an inorganic oxide and a salt by means of a known technique, such as, for example, deep coating or ink-jet printing, which is a function of the hydrophilic or hydrophobic characteristics of the used substrate, or inserting them in the final stage of the substrate manufacture by means of conformation or other similar technique.

According to the description of the previous products, the nanoparticles to be used in the ink solutions or to be inserted as precursors in the manufacturing stage of the substrate can have an inorganic, or organic, or mixed nature. In the case of inorganic nanoparticles, these will be made of oxides of Ti, Nb, Mo, Ta, and W to afford a cathodic colouring, or oxides of Cr, Mn, Fe, Co, Ni, Rh, and Ir to afford an anodic colouring.

According to what was previously described, the organic nanoparticles will be made of vialogens and polymeric materials, such as polyaniline.

According to what was previously described, the electrolytic and charge storage functions are due to a Lithium-containing inorganic salt, such as $Li_3N$, $LiALF_4$, $LiNbO_3$, or polymeric salt of $LiClO_4$, $LiI$, $LiBr$, $LiAsF_6$, and $LiCF_3SO_3$, which is inserted into the substrate by dipping the latter in a chemical solution, as is the case of paper, or the salt is inserted into the bulk of the substrate, during the final stage of the substrate manufacture.

According to what was previously described, when the different particles that constitute the electrolyte and electrochromic materials are not inserted during the substrate manufacture process, after dipping the substrate, such as, for example, paper, in the different solutions one should then proceed to the drying thereof in order to remove the solvent, and finally the two transparent electrodes (TCO) are deposited on both sides of the paper sheet or at the far ends of the region of the paper surface prepared for the connection of the electrical contacts. The electrodes are connected to an external power source, by means of which the potential difference is applied to the device. When applying this potential difference, the ions from the salt will migrate into the electrochromic material. The colouring appears alternately on either side of the substrate depending on the direction of application of the potential difference, always colouring the face where the negative terminal lies. By interchanging the source polarization, the ions will migrate through the cellulosic matrix into the other side of the substrate, and now that side becomes coloured and the opposite side becomes transparent. In this way, the cellulosic substrate soaked up in the previously described solution presents simultaneously 4 different functions according to the conventional electrochromic cells, which are: substrate (1), electrochromic material (2), electrolyte (3), and counter-electrode.

According to what was previously described, the device might contain three transparent conductive electrodes (gate, source, and drain) that allow applying or inducing the electric field and electric charges, respectively.

Presently, neither any known patent nor the state of the art comprises the presently disclosed subject matter. The search done in several databases of patent records showed that none of the processes, products, and operating systems of the substrate that are an aspect of the presently disclosed subject matter is described in the state of the art.

Example of Development of the Device with Functionalized Substrate and Non-Functionalized Substrate a) Functionalized Substrate For processing an electrochromic device as previously described it is possible to use different electrochromic materials as well as salts, but as an example we mention the case of a device developed from a paper substrate with a solution of nanoparticles of tungsten trioxide ($WO_3$) and lithium perchlorate ($LiClO_4$).

1. Preparation of the Substrate

It is not necessary to perform on the substrate any kind of pre-treatment or cleaning procedure. It is only required to provide a porous substrate with the desired dimensions.

2. Preparation of the Solution

The solution of nanoparticles of $WO_3$ is prepared from hydrogen peroxide ($H_2O_2$) and metallic tungsten (W). W is added to $H_2O_2$, the mixture is allowed to rest until a clear solution is obtained, and then the solution is heated until a yellow powder is formed. At this stage acetic acid is added. The heating of the solution is continued until total evaporation of the solvent occurs. The resultant yellow powder is dispersed in anhydrous ethanol. This dispersion is allowed to rest for several days. Thereafter lithium perchlorate is added.

3. Deposition of the Solution onto the Substrate

The substrate is completely immersed in the previously described solution for 1 to 5 minutes. Thereafter the substrate is dried in a heater plate at a temperature of 50 to 100° C. for 45 to 75 seconds.

4. Deposition of the Electrodes

The gate, drain, and source electrodes are deposited on both sides of the previously described substrate using a mechanical mask, or writing them down by ink-jet techniques, or otherwise using the known lithographic techniques and transparent materials in the visible region, such as, for example, IZO (zinc-doped indium oxide); GZO (gallium-doped zinc oxide); multicomponent oxide of zinc, gallium, and indium, or zinc, gallium, or tin, or alike, having the electrical properties of a degenerate semiconductor, by means of one of the previously mentioned techniques, such as, for example, the sputtering technique at room temperature.

b) Non-Functionalized Substrate

In what follows a manufacture example is presented using a vitroceramic substrate and some of the materials that can be used for the creation and manufacture of the thin film transistor.

1. Preparation of the Stiff Substrate

Initially it is immersed in isopropyl alcohol at temperatures ranging between 30° C. and 50° C., wherein the temperature of 50° C. is chosen for this particular example, in an ultrasound bath for a period of 15 minutes. After this time period, the substrate is withdrawn from the alcohol and is immersed in ultra-pure water at temperatures ranging between 40° C. and 65° C. 50 for a period equal to the previous one. Thereafter, the substrate is dried with a nitrogen jet.

2. Deposition of the Gate Electrode

Using the magnetron-assisted sputtering technique at temperatures ranging between the room temperature and 450° C., the degenerate semiconductive oxide with high conductivity, possibly having an amorphous structure, is deposited according to a pattern that might involve a mechanical mask or lithographic processes, such as lift-off. Thereafter it is subjected to a cleaning procedure in order to prepare the thus coated surface to the second manufacture stage.

3. Deposition of the Insulation Islands

Using the same magnetron-assisted sputtering technique or ink-jet printing, one proceeds to the deposition of an insulating material, like amorphous multicomponent compounds of tantalum and silicon, or tantalum and aluminium, or tantalum and hafnium, or polymeric compounds, such as, for example, polymethyl methacrylate PMMA, according to a pattern associated with a (mechanical or photoresist) mask or by direct writing. In this way the electrical insulation of the gate electrode from the layers that follow, namely the electrolyte and electrochromic materials, is ensured.

4. Preparation of the Polymeric Electrolyte

A material highly sensitive to the charge accumulation process, such as, for example, previously dried lithium perchlorate ($LiClO_4$), is dissolved in propylene carbonate (PC), solution M, inside a controlled atmosphere glove box. In parallel, the organic material that will work as electrolyte material, such as, for example, polymethyl methacrylate (PMMA), is dissolved in ethyl acetate in a ratio ranging from 1:5 to 1:10. Finally, the previous solution is mixed with $LiClO_4$+PC [1 M] in a ratio ranging from 2:5 to 2:10, in order to incorporate the marker in the electrolyte. All this is done according to a previously drawn mask pattern.

5. Deposition of the Electrochromic Material ($WO_x$, $0 < x \leq 3$)

Tungsten trioxide is deposited onto the structure using the same pattern that was employed for depositing the electrolyte, with the corresponding tolerances associated with the etching method used, by means of a physical deposition technique, such as resistive thermal evaporation, electron gun thermal evaporation, sputtering, or by a chemical process, such as ink-jet printing, or sol-gel, or pyrolysis, or deep coating, at temperatures ranging from 20° C. to 450° C. In the case of the physical techniques, the film growth ratios can be very high, larger than 3 nm/s, and the process costs can be very low, namely in the case of resistive thermal evaporation, when compared to other deposition techniques like electron gun-assisted thermal evaporation or sputtering.

6. Device Assembly

Mounting a glass or other transparent inorganic or organic material on top of the device for encapsulation is an optional step, but it corresponds to the sealing and protecting process of the device with the purpose of making the operation thereof independent of the environmental conditions to which it is subjected. This encapsulation procedure can be carried out by means of any technique known in the field of product assembly processes, such as, for example, lamination.

Applications

The major industries that presently might use the devices and circuits provided by using this innovation are the entire electronics industry, the semiconductor industry, the industry of flat displays and alike, the automotive industry, the paper industry, the advertising industry, the glass industry, the plastic industry, the instrumentation and sensor industry, the food industry, the medical and biotechnological industry, the optoelectronics industry, the micro- and nanoelectronics industry.

An aspect of the presently disclosed subject matter is to replace the current electrochromic devices of the electrochromic diode type by electrochromic thin film transistors, which allow producing matrices with large areas wherein the pixel is the very channel region of the transistor that changes its colour, thereby allowing to build large areas shaped as a display that switch between the transparent or translucent or opaque or coloured states in periods of the order of a few seconds, compared to several dozens of minutes required to switch the transparency state of windows with more than 2 square meters in area. In addition, the change of the colour state is associated with a variation of the current flowing between the drain and the source of several orders of magnitude, providing the matrix with another active function that can be used to turn coloured advertisements and static or dynamic figures visible or invisible, similarly to what happens with the current liquid crystal displays (LCD) or with organic light emitting diodes (OLED).

On the other hand, the required technological manufacture processes are compatible with the ones already existing in the electronics, or optoelectronics, or semiconductor industries, namely the sputtering processes intended for large areas, or thermal evaporation, or sol-gel, or ink-jet, thereby not requiring large investments as far as research and technological adaptations are concerned.

The technical advantages provided by the presently disclosed subject matter allow the active use of functionalized substrates either in a dynamic or static way, acting simultaneously as substrate and component of the electrochromic devices based on the same.

Although an exemplary embodiment has been described in detail, it should be understood that several variations, substitutions, and modifications can be made without departing from the scope of the presently disclosed subject matter, even if all the advantages identified above are not present. The embodiments presented herein illustrate the presently disclosed subject matter, which can be implemented and incorporated in a variety of different forms that fit in the scope thereof. Also the techniques, constructions, elements, and processes described and illustrated in an exemplary embodiment as being distinct or separated can be combined with or integrated into other techniques, constructions, elements, or processes, without departing from the scope of the invention. Although the presently disclosed subject matter has been described in various embodiments, these can still be modified according to the application scope of the presently disclosed subject matter. Other examples of variations, substitutions, and modifications can be easily determined by those skilled in the art, and could be inserted without departing from the spirit and scope of the presently disclosed subject matter.

BIBLIOGRAPHY

[1] Zhang Xuping, Zhang Haokang, Li Qing, and Luo Hongli, "*An All-Solid-State Inorganic Electrochromic Display of $WO_3$ and NiO Films with $LiNbO_3$ Ion Conductor*" IEEE ELECTRON DEVICE LETTERS, VOL. 21, NO. 5, MAY 2000.

[2] C. O. Avellaneda, D. F. Vieira, A. Al-Kahlout, E. R. Leite, A. Pawlicka, M. A. Aegerter, "*Solid-state electrochromic devices with $Nb_2O_5$:Mo thin film and gelatin-based electrolyte*", Electrochimica Acta (2007), doi:10.1016/j.electacta. 2007.05.065

[3] S. Papaefthimiou, G. Leftheriotis, P. Yianoulis, "Study of electrochromic cells incorporating $WO_3$, $MoO_3$, $WO_3$—$MoO_3$ and $V_2O_5$ coatings", Thin Solid Films, vol. 343-344, 183-186, 1999

[4] C. G. Granqvist, A. Azens, A. Hjelm, L. Kullman, "Recent advances in electrochromics for smart windows applications", Solar Energy vol. 63, n° 4, 199-216, 1998.

[5] C. G. Granqvist, "Hand book of inorganic electrocromic materials", Elsevier, Amsterdam, 2002.

[6] R. Gordon, S. Barry, J. Barton, R. Broomhall-Dillard, "Atmospheric pressure chemical vapor deposition of electrochromic tungsten oxide films", Thin Solid Films, 392, 231-235, 2001.

[7] D. Gogova, A. Iossifova, T. Ivanova, Z. Dimitrova, K. Gesheva, "Electrochromic behavior in CVD grow tungsten oxide films", Journal of Crystal Growth, 198/199, 1230-1234, 1999.

[8] G. Fang, K. Yao, Z. Liu, "Fabrication and electrochromic properties of double layer $WO_3(V)/V_2O_5(Ti)$ thin films prepared by pulsed laser ablation technique", Thin Solid Films, 394, 64-71, 2001.

[9] S. Badilescu, P. Ashirt, "Study of sol-gel prepared nanostructured $WO_3$ thin films and composites for electrochromic applications", Solid State Ionics, 8830, 1-11, 2002.

[10] M. Hashizume, T. Kunitake, "Preparation and functionalization of self-supporting (polymer/metal oxide) composite ultrathin films", RIKEN Review, n° 38: Focused on Nanotechnology in RIKEN II, 2001.

[11] M. Regragui et al., "Electrochromic effect in $WO_3$ thin films prepared by spray pyrolysis", Solar Energy Materials & Solar Cells, 77, 341-350, 2003.

[12] S. Lee, H. Cheong, J. Zhang, A. Mascarenhas, D. Benson, S. Deb, "Electrochromic mechanism in a-$WO_3$-y thin films", Applied Physics Letters, vol. 74 n° 2, 242-244, 1999

[13] J. Scarminio, "Tensões mecânicas observadas nos efeitos electrocrômico e fotocrômico em filmes de óxido de tungsténio", Revista brasileira de aplicações de vácuo, 20, 52-57, 2001.

[14] K. Bange, "Colouration of tungsten oxide films: A model for optically active coatings", Solar Energy Materials & Solar Cells 58, 1-131, 1999

[15] H. W. Heuer et al., "Electrochromic window based on conducting PEDT/PSS", Advanced Functional Materials, n° 2, 92, 2002.

[16] S. Papaefthimiou, G. Leftheriotis, P. Yianoulis, "Study of $WO_3$ films with textured surfaces for improved electrochromic performance", Solid State Ionics, 139, 135-144, 2001.

The invention claimed is:

1. Solid state electrochromic thin film transistor comprising
   substrate,
   gate,
   source and drain,
   nanoparticle electrochromic material connecting said source and drain,
   electrolyte between said gate and said electrochromic material,
   wherein both nanoparticle electrochromic material and electrolyte are contained within said substrate,
   wherein said gate is on a first side of said substrate, and the source and drain are on the second side of said substrate.

2. Transistor according to claim 1 wherein the electrolyte is a polymeric material comprising one or more of $LiClO_y$, with $0 < y \leq 4$, $LiClO_4$, LiI, LiBr, $LiAsF_6$, $LiCF_3SO_3$, or an inorganic nanoparticle solid comprising one or more of $Li_xN$, with $0 < x \leq 3$, $Li_3N$, $LiALF_y$, with $0 < y \leq 4$, $LiALF_4$, $LiNbO_z$, with $0 < z \leq 4$, $LiNbO_3$.

3. Transistor according to claim 1 wherein the electrochromic material is inorganic comprising oxide nanoparticles of one or more of Ti, Nb, Mo, Ta, W, Cr, Mn, Fe, Co, Ni, Rh, Ir.

4. Transistor according to claim 3 wherein the electrochromic material is tungsten oxide, WOx, with $0<x\leq 3$.

5. Transistor according to claim 1 wherein the electrochromic material is one or more of vialogen, polyaniline, multicoloured electrochromic polymer.

6. Transistor according to claim 1 wherein said electrochromic material is contained within a layer of the substrate, gate on the face of the substrate nearest to the electrolyte layer, and with said source and drain on the face of the substrate nearest to the electrochromic material layer.

7. Transistor according to claim 1 further comprising a dielectric layer between gate and electrolyte, said dielectric layer being permeable to ionic charge inducement.

8. Transistor according to claim 7 wherein the dielectric layer is a layer up to 1000 nm in thickness comprising one or more of zinc oxide; amorphous multicomponent compounds of tantalum and silicon, or tantalum and aluminium, or tantalum and hafnium; insulating polymeric compounds comprising polymethyl methacrylate PMMA or polyvinyl.

9. Transistor according to claim 1 further comprising insulation between the gate and connecting areas.

10. Transistor according to claim 9 wherein the insulation is one or more of amorphous multicomponent compounds of tantalum and silicon, or tantalum and aluminium, or tantalum and hafnium; insulating polymeric compounds; polymethyl methacrylate PMMA or polyvinyl.

11. Transistor according to claim 1 wherein the substrate is flexible and suitable for self-support of the transistor.

12. Transistor according to claim 1 wherein the substrate is vitroceramic, glass, polymeric, metallic, or natural, synthetic or mixed paper, plasticized cardboard, or mylar.

13. Transistor according to claim 1 wherein the substrate is hydrophilic and the insulation is hydrophobic.

14. Transistor according to claim 1 further comprising an encapsulation and/or passivation layer.

15. Transistor according to claim 1 wherein said gate, source, drain, electrochromic material and/or electrolyte layers have thicknesses ranging between 1 nm and 50 µm, the dielectric layer thickness more than 0 and less or equal to 1000 nm, and said nanoparticle size is less or equal to 200 nm.

16. Transistor according to claim 1 wherein the electrolyte and/or electrochromic material are stoichiometric.

17. Solid state electrochromic thin film transistor comprising
  gate,
  source and drain,
  nanoparticle electrochromic material connecting said source and drain,
  electrolyte between said gate and said electrochromic material,
  wherein said electrolyte is a polymeric material comprising one or more of LiClOy, with $0<y\leq 4$, LiClO4, LiI, LiBr, LiAsF6, LiCF3SO3, or an inorganic nanoparticle solid comprising one or more of LixN, with $0<x\leq 3$, Li3N, LiALFy, with $0<y\leq 4$, LiALF4, LiNbOz with $0<z\leq 4$, LiNbO3;
  wherein said electrochromic material is inorganic comprising oxide nanoparticles of one or more of Ti, Nb, Mo, Ta, W, Cr, Mn, Fe, Co, Ni, Rh, Ir.

18. Method for manufacturing a solid state electrochromic thin film transistor comprising the steps of:
  depositing, over a porous substrate, a nanoparticle solution comprising electrolyte and electrochromic material, or, in alternative to the previous step, depositing, over a porous substrate, a solution comprising electrolyte on a first side of said substrate and a nanoparticle solution comprising electrochromic material on the second side of said substrate,
  drying said substrate,
  depositing a gate electrode on the first side of said substrate, drain and source electrodes on the second side of said substrate.

19. Method according to claim 18 wherein:
  the electrolyte is a polymeric material comprising one or more of LiClOy, with $0\leq y\leq 4$, LiClO4, LiI, LiBr, LiAsF6, LiCF3SO3, or an inorganic nanoparticle solid comprising one or more of LixN, with $0<x\leq 3$, Li3N, LiALFy, with $0<y\leq 4$, LiALF4, LiNbOz $0<z\leq 4$, LiNbO3;
  the electrochromic material is inorganic comprising oxide nanoparticles of one or more of Ti, Nb, Mo, Ta, W, Cr, Mn, Fe, Co, Ni, Rh, Ir, or organic comprising one or more of vialogen, polyaniline, multicoloured electrochromic polymer.

20. Method according to claim 18 wherein the nanoparticle solution, comprising electrolyte and electrochromic material, comprises WO3 and LiClO4.

21. Method according to claim 18 wherein depositing of said nanoparticle solution, comprising electrolyte and electrochromic material, over said porous substrate, comprises the step of soaking the substrate in the nanoparticle solution for 1 to 5 minutes.

22. Method according to claim 18 further comprising the previous preparation of said nanoparticle solution comprising electrolyte and electrochromic material, which comprises the steps of:
  mixing W with H2O2,
  resting until clear,
  heating until formation of yellow powder,
  adding acetic acid,
  continue heating until total evaporation,
  dissolving in anhydrous ethanol,
  resting until dispersed,
  adding LiClO4.

23. Method for manufacturing a solid state electrochromic thin film transistor comprising the steps of:
  depositing a gate electrode on a substrate
  depositing insulation between the gate and subsequent connecting areas
  depositing a polymeric electrolyte solution on said substrate
  depositing an electrochromic material
  depositing drain and source electrodes
  wherein said electrolyte is a polymeric material comprising one or more of LiClOy, with $0<y\leq 4$, LiClO4, LiI, LiBr, LiAsF6, LiCF3SO3,
  wherein said electrochromic material is inorganic comprising oxide nanoparticles of one or more of Ti, Nb, Mo, Ta, W, Cr, Mn, Fe, Co, Ni, Rh, Ir.

24. Method according to claim 23 further comprising the previous preparation of said polymeric electrolyte solution, which comprises the steps of:
  dissolving polymethyl methacrylate PMMA in ethyl acetate from 1:5 to 2:10,
  mixing from 2:5 to 2:10 with dissolved LiClO4 in propylene carbonate 1M.

25. Method according to claim 23 wherein the depositing of insulation between the gate and subsequent connecting areas comprises depositing one or more of amorphous multicomponent compounds of tantalum and silicon, or tantalum and aluminium, or tantalum and hafnium; insulating polymeric compounds comprising polymethyl methacrylate PMMA.

26. Method according to claim 23 wherein the depositing of the gate, drain and source electrodes comprises the step of depositing a metal or a transparent conductive oxide.

* * * * *